United States Patent [19]

Dugan

[11] 4,125,441
[45] Nov. 14, 1978

[54] ISOLATED BUMP CIRCUITRY ON TAPE UTILIZING ELECTROFORMING

[75] Inventor: William P. Dugan, Pomona, Calif.

[73] Assignee: General Dynamics Corporation, Pomona, Calif.

[21] Appl. No.: 873,461

[22] Filed: Jan. 30, 1978

[51] Int. Cl.$^2$ .................. C25D 1/00; C25D 1/04; C25D 1/20

[52] U.S. Cl. .................. 204/12; 156/650; 156/661; 156/666; 204/4

[58] Field of Search ............ 204/3, 4, 11, 281, 12, 204/6; 156/644, 650–652, 661, 664, 666

[56] References Cited

U.S. PATENT DOCUMENTS

| | | | |
|---|---|---|---|
| 1,709,327 | 4/1929 | Spalding et al. | 156/651 |
| 2,250,436 | 7/1941 | Norris | 204/11 |
| 2,854,336 | 9/1958 | Gutknecht | 156/650 |
| 2,984,595 | 5/1961 | Schumpelt et al. | 204/281 |
| 3,181,986 | 5/1965 | Pritikin | 204/281 |
| 3,414,487 | 12/1968 | Helms et al. | 204/11 |

Primary Examiner—T. M. Tufariello
Attorney, Agent, or Firm—Henry M. Bissell; Edwin A. Oser; Edward B. Johnson

[57] ABSTRACT

A process for electroforming a bump circuit and a lead circuit on a tape to be used for making contact with integrated circuit chips and the like. By means of the process, an inverse bump pattern is produced. To this end, a first metal plate is coated with a photoresist on one surface and suitable apertures are made in the photoresist in a conventional manner. Now indentations are chemically etched, partly through the uncovered metal surface to form a bump circuit. Next the photoresist is completely removed and the metal plate is again covered with a layer of photoresist. After the photoresist is developed again to form a lead circuit, the metal is chemically etched partly through the uncovered metal to form a lead circuit while at the same time further etching the bump circuit indentations. These indentations are now covered with metal by various plating steps. For example, the indentations may be covered successively with layers of gold, nickel, copper, and an additional layer of gold. The original metal is then removed by chemical etching. Either the remaining photoresist may remain or else the remaining photoresist is completely removed and a new layer of photoresist is applied over the entire structure before the original metal is removed by chemical etching. The final product is an electroformed lead and bump circuit on a tape to provide a flexible carrier.

7 Claims, 10 Drawing Figures

ISOLATED BUMP CIRCUITRY ON TAPE UTILIZING ELECTROFORMING

CROSS REFERENCES TO RELATED APPLICATIONS

The present application is generally related to the copending application to Dugan entitled "Method of Making Circuitry With Bump Contacts" Ser. No. 873,460, and to the application to Dugan and Phillips entitled "Bump Circuits on Tape Utilizing Chemical Milling" Ser. No. 873,453, both applications being filed concurrently herewith and both applications being assigned to the assignee of the present application.

BACKGROUND OF THE INVENTION

1. Field of the Invention.

The present application generally relates to bump and lead circuits arranged on a flexible tape, and particularly relates to a method of electroforming both the bump circuit and the lead circuit and to deposit it on a flexible tape.

2. Description of the Prior Art.

Carriers providing a bump circuit on one surface and a lead circuit on the other are well known in the art. They are used for making electrical contact with the terminals of semiconductor devices such, for example, as integrated circuit chips. The leads provide connections from the semiconductor terminals to other elements. The bumps or pads disposed on the surface opposite the lead circuit serve the purpose of facilitating contact with the semiconductor terminals. This is usually effected by a heat ram for thermally bonding the bumps to the terminals.

It is conventional practice to generate the lead and bump circuits by chemical etching. In other words, a plate of a suitable metal, such as copper, for example, is subject to chemical etching through a photoresist which has been illuminated through a mask and developed to expose the metal at places adjacent the bumps which are to be provided.

In accordance with the present invention, both the bump circuit and the lead circuit are formed, not by a chemical etching process, but by electroforming. In this connection, reference is made to a patent to Sanz et al., U.S. Pat. No. 3,350,250. This patent relates to a method of making printed wire circuitry. Specifically, FIGS. 14–18 of the patent disclose a particular fabricating technique for a printed wire circuit. Here a temporary base member is drilled to provide a recess or indentation. This in turn is covered with a layer of conductive material to coat the recess. The conductive material forms a funnel-shaped protrusion which may be internexted with others to form electrically conductive interconnections. However, these protrusions are hollow.

Reference is also made to a patent to Pritikin, U.S. Pat. No. 2,692,190. It discloses various fabricating steps, again for making inlaid circuits. It should be noted that these inlaid or printed circuits are not provided with bumps.

The patent to Gigoux, U.S. Pat. No. 3,913,223, discloses a method of manufacturing a double-sided circuit, such as a printed circuit having raised through-hole eyelets shown particularly in FIGS. 3–5, 10 and 11. Basically an aperture is made in a laminated sheet which is then covered with metal to provide a through-hole eyelet. It should be noted that none of these patents relate to the type of bump and lead circuits on a tape to which the present invention is directed.

Other patents relate generally to various circuit fabrication techniques. Thus, the patent to Jackson, Jr., et al., U.S. Pat. No. 3,508,980, relates to an integrated circuit structure. It is made with dielectric isolation. Among others it discloses a chromium layer formed, for example, by vacuum evaporation deposition, which serves as a highly conductive region. This in turn will provide a ohmic contact to transistors.

The two patents to Carbonel, U.S. Pat. Nos. 3,583,066 and 3,566,461, both relate to a method of making a magnectic circuit element.

Finally, reference is made to a patent to Norton, U.S. Pat. No. 3,424,658, which also relates to a process for providing a printed circuit board on a metallic substrate. However, the circuit is not provided with any bumps, which are essential for the circuit of the present invention.

SUMMARY OF THE INVENTION

In accordance with the present invention, a process is provided for electroforming a bump circuit and a lead circuit on a tape. To this end, a first metal plate or base is coated with a photoresist on one surface thereof. The photoresist is removed from those areas where bumps are to be formed. Where the metal is bared, indentations are chemically etched partly through the metal surface to form a bump circuit. Now the photoresist is completely removed. The surface of the metal plate is again covered with a layer of photoresist which is again removed over those areas where a lead circuit is to be formed. The next step is chemically etching partly through the uncovered metal to form a lead circuit. At the same time the bump indentations are additionally ethced to make them deeper than the lead indentations.

Now a second metal is plated over the exposed surface of the first metal, the second metal being of the type which resists a chemical etch for the base metal. Thus the first metal may consist of copper and the second of gold. The layer of gold may now be followed by a layer of nickel, a layer of copper, and a second layer of gold, all plated over the original layer of gold. Now the copper plate may be removed by chemical etching.

The original layer of photoresist may remain and may form the necessary tape. Alternatively, the photoresist is removed and a new layer of photoresist is applied over the entire surface of the bump and lead circuit. The photoresist may be of the type which is capable of being melted by the thermal bonding process of the tape to an integrated circuit chip structure. Alternatively, the photoresist may be removed over those areas through which openings are to be provided, such as a window surrounded by the bump circuit.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawings.

DESCRIPTION OF THE PREFERRED EMBODIMENTS

Figure 1:
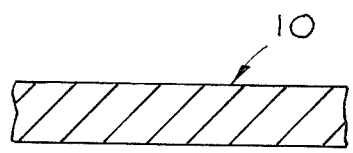
FIGS. 1–4 are a series of fragmentary sectional views corresponding to successive process steps in the preparation of an electroformed carrier in accordance with the present invention, FIG. 1 being taken as shown by line 1—1 of FIG. 5.
Figure 5:
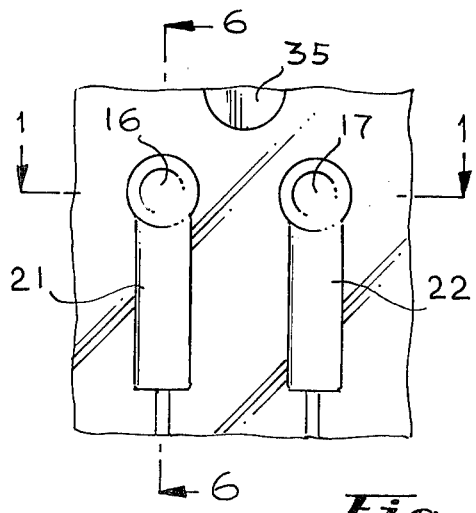
FIG. 5 is a plan view of a portion of the carrier of FIG. 4.

Referring now to the drawings and particularly to FIGS. 1-5, there is shown a series of fragmentary, sectional views in FIGS. 1-4 illustrating successive process steps for preparing an inverse bump circuit and lead circuit, while FIG. 5 illustrates a plan view of a portion of such a lead and bump circuit. FIG. 1 illustrates a metal plate 10 which may, for example, consist of copper. The metal plate 10 serves as a temporary base which is subsequently removed by etching. Therefore, the plate 10 may consist of any metal which can be etched while another metal is eventually plated over the indentations made in the plate 10, the other metal resisting the chemical etch for the plate 10.

Figure 2:
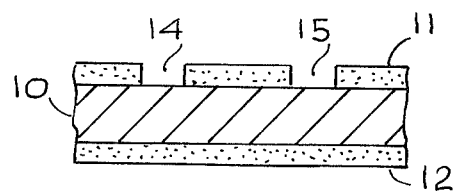

The plate 10 is now covered with a layer of photoresist 11 on one surface, say the top surface as shown in FIG. 2, while the bottom surface may also be covered with a layer of photoresist 12. The photoresist layer 11 is now illuminated with suitable light through a mask so that certain portions of the photoresist may be removed. This will now uncover the copper plate 10 in certain areas 14 and 15 corresponding to the desired pattern of the bumps.

Figure 3:
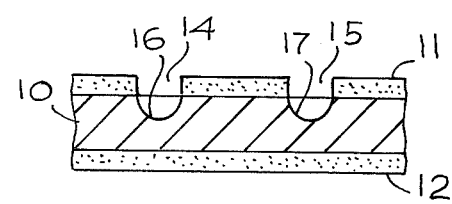
Figure 4:
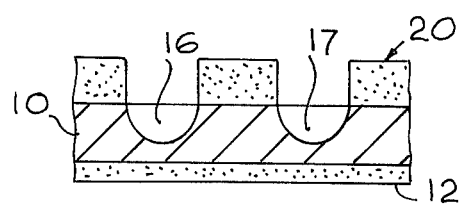

Subsequently as shown in FIG. 3, the copper plate 10 is etched with a suitable chemical etching solution. The metal is exposed to the chemical etching only long enough to form indentations as shown at 16 and 17 partly through the uncovered metal surface at 14 and 15.

During the next step in the process, the photoresist layer 11 is entirely removed by a suitable solvent. Subsequently, a new layer of photoresist 20 is applied again over the entire surface of the metal plate 10. The photoresist layer 20 is again illuminated by a light source through a suitable mask. Subsequently, the areas of the photoresist corresponding to the desired lead circuit are removed. This, of course, will include the areas 14 and 15 on which the indentations 16 and 17 have been made for the bump circuit. The layer 12 of photoresist may remain to protect the lower surface of the copper plate 10.

The plate 10 is again subjected to a chemical etching process to etch partly through the uncovered metal to form the lead circuit. Since the lead circuit surrounds the bump circuit, it will be evident that the bumps to be formed at 16 and 17 will be additionally etched. This in turn insures that the indentations for the bumps, such as 16 and 17, are etched deeper than the indentations, such as 21 and 22, shown in FIG. 5 forming the lead circuit. It will now be evident that the structure, shown in plan view in FIG. 5, forms a matrix for electroforming a bump circuit and a lead circuit thereover.

How this is accomplished and how a tape is formed about the bump and lead circuits will now be explained in connection with FIGS. 6-10. It should be noted that FIGS. 6-10 are taken at right angles to the sections of FIGS. 1-4, as shown at the line 6—6 of FIG. 5.

Figure 6:
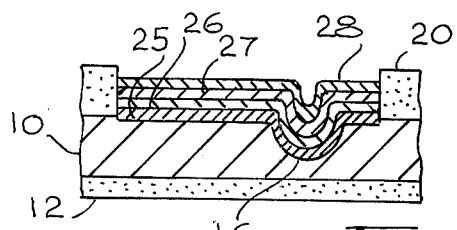
FIGS. 6-10 are another series of fragmentary sectional views taken at right angles to the sectional views of FIGS. 1-4 and corresponding to further process steps in the preparation of a carrier, and to some modifications of the process steps in accordance with the present invention, FIG. 6 being taken as shown by line 6—6 of FIG. 5.

Referring now specifically to FIG. 6, the next process step is to plate a second metal layer 25 over the areas of plate 10 into which indentations have been etched, including the indentation 16 corresponding to one of the bumps. This metal layer 25 should be of a metal which resists the chemical etch to be applied subsequently to the copper layer 10. Hence the metal layer 25, which is plated over the copper plate 10, preferably consists of gold.

Subsequently, a metal layer 26, such as nickel, is plated over the gold layer 25, to be followed with a copper plate 27 and another gold plate layer 28. The copper layer 27 serves to improve conductivity of the structure because the conductivity of copper is better than that of gold.

Generally, the height of a bump in a bump circuit may be on the order of three mils while that of the lead circuit may be somewhat less, such as one-and-one-half to two mils. The temporary base plate 10 may be somewhat thicker and may be on the order of ten mils. The plating may be effected in a suitable plating bath.

Figure 7:
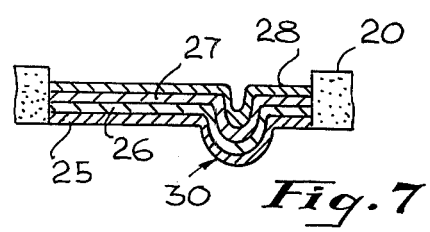

The next process step is illustrated in FIG. 7. First the photoresist layer 12 on the reverse side of the copper plate 10 is removed by a suitable solvent. Subsequently, the copper layer 10 is removed by chemical etching. The resulting structure is shown in FIG. 7. The structure comprises of the successive layers 25, 26, 27 and 28, consisting respectively, for example, of gold, nickel, copper and gold. A bump 30 is formed in the structure and the entire structure is tightly held by the photoresist layer 20, which will be evident from the manner in which the lead circuit is formed. This may then be utilized as the finished product.

Figure 8:
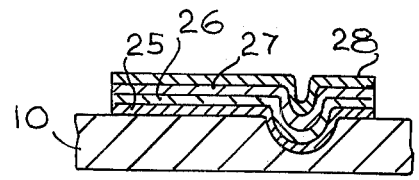

Alternatively, referring back to the structure of FIG. 6, the remaining photoresist 20 may now be removed as shown in FIG. 8 before the copper sheet 20 is removed.

Figure 9:
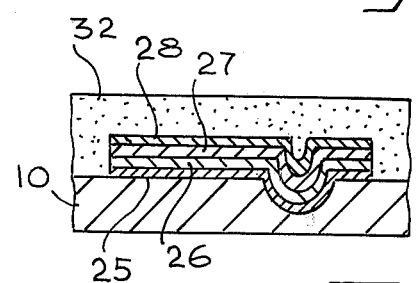
Figure 10:
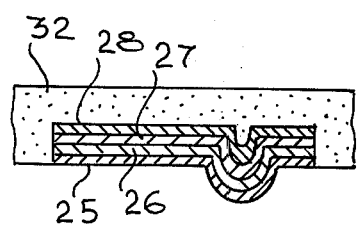

Subsequently, as shown in FIG. 9, a new layer of photoresist 32 which may consist of polyimide is applied over the entire structure of FIG. 8, including the surface of the gold layer 28. The layer of photoresist 32 now serves as the plastic carrier. The new layer 32 of photoresist may now be treated as previously described by illuminating it and developing it to uncover the metal layer 10 in the area 35 (see FIG. 5) to form a window central of the bumps for the application of heat to the carrier to thermally bond the bumps to a semiconductor device, such as an integrated circuit chip. This combination may again be treated by etching to etch away the necessary window and to remove the temporary base layer 10. The resulting finished structure is illustrated in FIG. 10 (the window 35 not being shown).

As another alternative, it may not be necessary to remove the photoresist over the areas where windows are to be formed. In this case, the photoresist should be of a type which can be burned away or evaporated upon the application of the heat ram. This step forms the final application of the finished carrier to thermally bond the bumps to the contact pads of the intergrated circuit chip.

There has thus been disclosed a process for electroforming an inverse bump circuit and an inverse lead circuit and for securing it to a flexible plastic tape. The bump circuit is made by chemically etching indentations partly through the uncovered metal surface of a temporary base. This is followed by a second etching step for the lead circuit which also partly etches through the uncovered metal surface. At that time the bumps for the bump circuit are made deeper so that the finished bumps or pads have a surface higher than that of the lead circuit. The resulting indentations are then plated with successive layers of metal to provide the bump circuit and the lead circuit. The temporary base is etched away and the bump and lead circuits may either remain on the original photoresist or a new photoresist may be applied over the entire surface of the structure from the lead side, leaving the bumps uncovered. The necessary windows may either be made by illuminating and developing the photoresist or else the photoresist may be of the type which can be melted away by the application of the heat ram which bonds the carrier to suitable semiconductor devices or circuit chips.

Although there have been described above specific arrangements of isolated bump circuitry on tape utilizing electroforming in accordance with the invention for the purpose of illustrating the manner in which the invention may be used to advantage, it will be appreciated that the invention is not limited thereto. Accordingly, any and all modifications, variations or equivalent arrangements which may occur to those skilled in the art should be considered to be within the scope of the invention as defined in the appended claims.

What is claimed is:

1. A process for electroforming a bump circuit and a lead circuit on a tape, said process comprising the steps of:
   (a) coating a first metal plate with a photoresist on one surface thereof;
   (b) removing the photoresist from those areas where bumps are to be formed;
   (c) chemically etching indentations partly through the uncovered metal surface to form a bump circuit;
   (d) completely removing the photoresist;
   (e) covering the surface of the metal plate again with a succeeding layer of photoresist;
   (f) removing the photoresist from those areas where a lead circuit is to be formed and including the previously formed indentations;
   (g) chemically etching partly through the uncovered metal to form the lead circuit and to additionally etch the bump circuit;
   (h) plating a second metal over the exposed surface of the first metal plate, said second metal being of a type which resists a chemical etch for the first metal; and
   (i) chemically removing the first metal plate.

2. The process as defined in claim 1 wherein the first metal consists of copper and the second metal consists of gold.

3. The process as defined in claim 2 wherein a layer of nickel, a layer of copper and finally another layer of gold is plated over the initial layer of gold.

4. The process as defined in claim 1 including the additional steps of removing the entire succeeding layer of photoresist and applying a new layer of photoresist over the entire surface of the bump and lead circuit.

5. The process as defined in claim 4 including the additional step of removing the photoresist over those areas through which openings are to be provided, such as sprocket holes.

6. The process as defined in claim 4 wherein the new layer photoresist is capable of being melted by the thermal bonding process of the tape to an integrated circuit chip structure.

7. A process for electroforming a bump circuit and a lead circuit on a tape, said process comprising the steps of:
   (a) coating a first metal plate with a photoresist on one surface thereof;
   (b) removing the photoresist from those areas where bumps are to be formed;
   (c) chemically etching indentations partly through the uncovered metal surface to form a bump circuit;
   (d) completely removing the photoresist;
   (e) covering the surface of the first metal plate again with a succeeding layer of photoresist;
   (f) removing the photoresist from those areas where a lead circuit is to be formed and including the areas of the bump circuit;
   (g) chemically etching deeper indentations through the uncovered metal surface to form a deeper bump circuit and a lead circuit;
   (h) plating a second metal over the exposed surface of the first metal plate;
   (i) laminating a layer of polyimide onto the lead side of the metal plate;
   (j) producing desired openings in the first metal plate; and
   (k) removing the first metal plate.

* * * * *